(12) United States Patent
Saeedi Vahdat et al.

(10) Patent No.: US 12,369,299 B2
(45) Date of Patent: Jul. 22, 2025

(54) DEVICES AND METHODS FOR DRAM LEAKAGE REDUCTION

(71) Applicant: Applied Materials, Inc., Santa Clara, CA (US)

(72) Inventors: Armin Saeedi Vahdat, Burlington, MA (US); John Hautala, Beverly, MA (US); Yan Zhang, Westford, MA (US); Johannes M. van Meer, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 536 days.

(21) Appl. No.: 17/881,969

(22) Filed: Aug. 5, 2022

(65) Prior Publication Data
US 2024/0049443 A1    Feb. 8, 2024

(51) Int. Cl.
*H10B 12/00*    (2023.01)

(52) U.S. Cl.
CPC ........... *H10B 12/053* (2023.02); *H10B 12/34* (2023.02)

(58) Field of Classification Search
CPC .. H10B 12/00; H10B 12/033; H10B 12/0387; H10B 12/053; H10B 12/34; H10D 30/668
See application file for complete search history.

(56) References Cited

U.S. PATENT DOCUMENTS

| | | | |
|---|---|---|---|
| 2020/0035567 A1* | 1/2020 | Chanemougame | H10D 84/0193 |
| 2020/0066726 A1* | 2/2020 | Fishburn | H10B 12/033 |
| 2021/0159324 A1* | 5/2021 | Wang | H10D 30/0297 |
| 2022/0190141 A1* | 6/2022 | Gu | H01L 21/265 |

* cited by examiner

*Primary Examiner* — Nelson Garces
(74) *Attorney, Agent, or Firm* — KDW Firm, PLLC

(57) ABSTRACT

Approaches for reducing GIDL are disclosed. In one example, a method of forming a DRAM device may include forming a trench in a substrate layer, providing a first gate oxide layer along a sidewall and a bottom surface of the trench, and forming a first gate material within the trench. The method may further include removing the first gate oxide layer along an upper portion of the sidewall of the trench by delivering ions into the upper portion of the trench at a non-zero angle relative to a perpendicular extending from an upper surface of the substrate layer, and forming a second gate oxide layer along the upper portion of the sidewall of the trench, wherein a first dielectric constant of the first gate oxide layer is greater than a second dielectric constant of the second gate oxide layer.

15 Claims, 3 Drawing Sheets

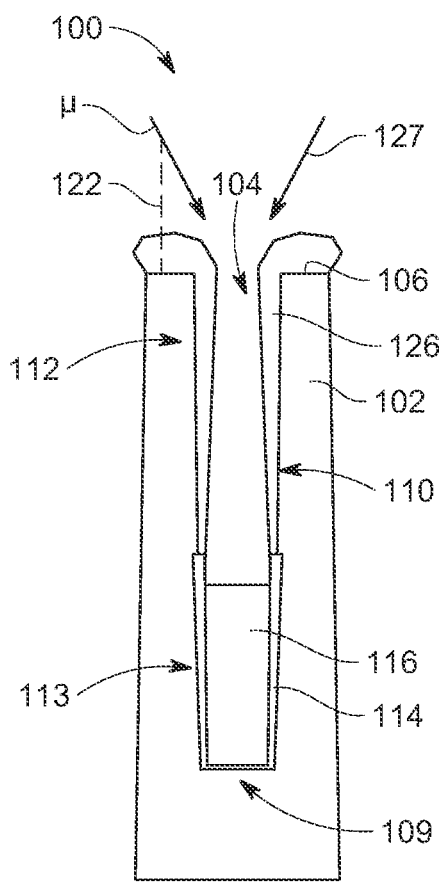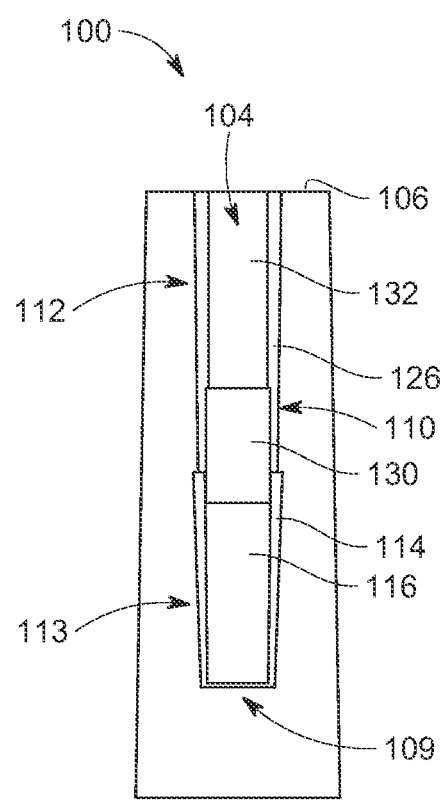
FIG. 3
FIG. 4

DEVICES AND METHODS FOR DRAM LEAKAGE REDUCTION

FIELD OF THE DISCLOSURE

The present disclosure generally relates to the processing of memory devices. More specifically, the disclosure relates to devices and methods for reducing DRAM leakage.

BACKGROUND OF THE DISCLOSURE

Among semiconductor memory devices, dynamic random-access memory (DRAM) devices include a plurality of unit cells each having a capacitor and a transistor. The capacitor is used to temporarily store data, and the transistor is used to transfer data between a bit line and the capacitor in response to a control signal (word line). The data transfer occurs by using a semiconductor property where electrical conductivity changes depending on environments. The transistor has three regions, i.e., a gate, a source, and a drain. Electric charges are moved between the source and the drain according to a control signal inputted to the gate of the transistor. The movement of the electric charges between the source and the drain is achieved through a channel region. The semiconductor property is used in the channel.

The current trend is to reduce DRAM size, which results in continuous reduction of cell capacitance node over node. Cell leakage due to access device gate induced drain leakage (GIDL) is a significant reliability issue in DRAM, which is amplified as cell capacitance and device size shrinks.

It is with respect to this and other drawbacks that the present disclosure is provided.

BRIEF DESCRIPTION OF THE DRAWINGS

The accompanying drawings illustrate exemplary approaches of the disclosure, including the practical application of the principles thereof, as follows:

FIG. 3 is a side cross-sectional view of the device following formation of a second gate oxide layer along the upper portion of the sidewall of the trench, according to embodiments of the present disclosure;

FIG. 4 is a side cross-sectional view of the device following formation of a second gate material and a capping layer, according to embodiments of the present disclosure.

Figure 1:
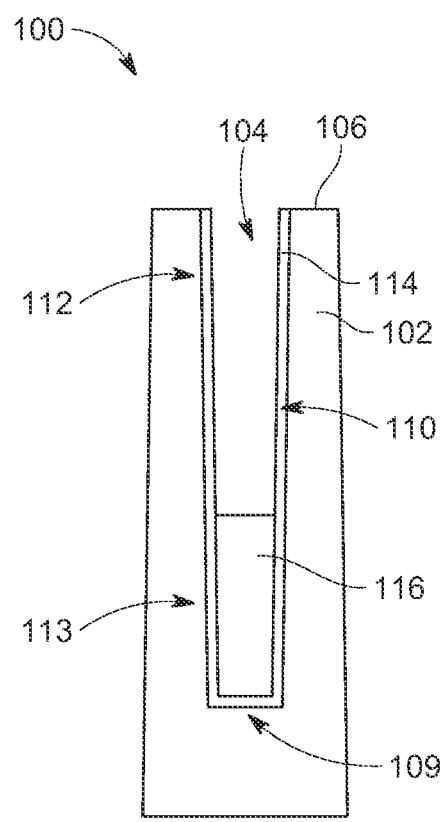
FIG. 1 is a side cross-sectional view of a device including a trench in a substrate layer, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Devices, systems, and methods in accordance with the present disclosure will now be described more fully hereinafter with reference to the accompanying drawings, where various embodiments are shown. The devices, systems, methods may be embodied in many different forms and are not to be construed as being limited to the embodiments set forth herein. Instead, these embodiments are provided so the disclosure will be thorough and complete, and will fully convey the scope of the apparatuses, systems, and methods to those skilled in the art.

Embodiments of the present disclosure are directed to novel integration schemes based on directional deposition and directional etch technologies. As will be hereinafter described, a gate oxide is locally removed and replaced in a poly-silicon gate region without impacting the gate oxide in a wordline metal region. The original gate oxide in poly-silicon gate region is replaced by a CVD oxide having a lower dielectric constant (low-k) than the original gate oxide. This results in further reduction in electric field and hence further GIDL leakage suppression. Avoiding additional processing in the wordline gate oxide region is critical to avoid interface defect increases.

FIG. 1 is a side cross-sectional view of a device 100, such as a semiconductor or memory device (e.g., DRAM), according to embodiments of the present disclosure. The device 100 may include a substrate layer 102 and an opening or trench 104 recessed (e.g., etched) into an upper surface 106 of the substrate layer 102. The trench 104 may be defined by a bottom wall 109 and a sidewall 110 having an upper portion 112 and a lower portion 113. As shown, a first gate oxide layer 114 may be formed along the bottom wall 109 and the sidewall 110. The first gate oxide layer 114 may extend to the upper surface 106 of the substrate layer 102.

After formation of the first gate oxide layer 114, a first gate material 116 may be deposited in a lower half of the trench 104, directly atop the first gate oxide layer 114. As shown, the first gate material 116 is formed along the lower portion 113 of the sidewall 110 without being formed along the upper portion 112 of the sidewall 110. Although non-limiting, the substrate layer 102 may be silicon and the first gate material 116 may be a metal or metal alloy (e.g., TiN/W). In some embodiments, the first gate material 116 may be deposited via a chemical vapor deposition (CVD) or an atomic layer deposition (ALD) process, resulting in hulk ALD or CVD growth.

Figure 2:
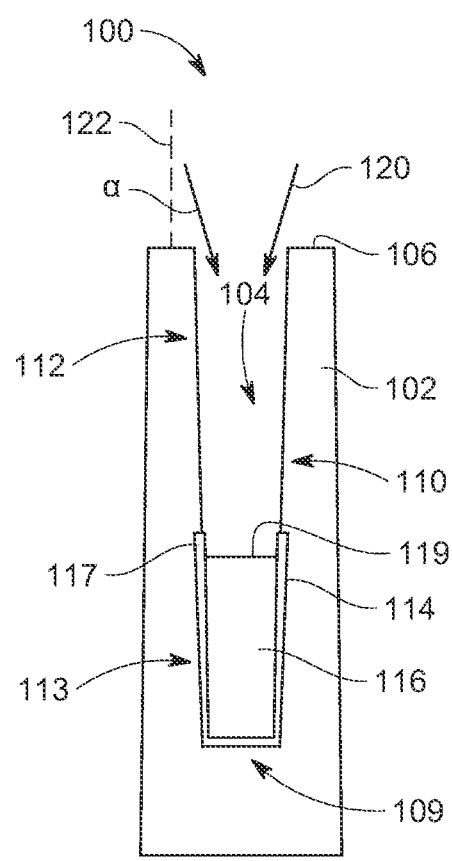
FIG. 2 is a side cross-sectional view of the device following removal of an upper portion of a first gate oxide layer within the trench, according to embodiments of the present disclosure.

FIG. 2 demonstrates the device 100 following removal of a portion of the first gate oxide layer 114 using an angled ion etch 120. As shown, the first gate oxide layer 114 may be removed along just the upper portion 112 of the sidewall 110 of the trench 104 by delivering ions into the upper portion 112 of the sidewall 110 at a first non-zero angle 'α' relative to a perpendicular 122 extending from the upper surface 106 of the substrate layer 102. The angled ion etch 120 is prevented from impacting the first gate material 116 and the first gate oxide layer 114 along the lower portion 113 of the sidewall. In some embodiments, a portion 117 of the first gate oxide layer 114 may extend above an upper surface 119 of the first gate material 116.

FIG. 3 demonstrates the device 100 following formation of a second gate oxide layer 126. In some embodiments, the second gate oxide layer 126 may be formed by delivering a gate oxide material 127 to the sidewall 110 of the trench 104 at a second non-zero angle "µ" relative to the perpendicular 122. The first non-zero angle 'α' may be the same as the second non-zero angle "µ" to ensure the gate oxide material 127 is delivered to the exposed portion(s) of the sidewall 110. As shown, the second gate oxide layer 126 is formed only along the upper portion 112 of the sidewall 110 without being formed over the first gate oxide layer 114 or over the first gate material 116. In some embodiments, the second gate oxide layer 126 may also be formed along the upper surface 106 of the substrate layer 102. A first dielectric constant of the first gate oxide layer 114 may be greater than a second dielectric constant of the second gate oxide layer 126. For example, the first dielectric constant may be greater than 4.0 and the second dielectric constant may be 3.9 or below. In some embodiments, the second dielectric constant may be between 1.0 and 3.9. Advantageously, by replacing the first gate oxide layer 114 in the poly-silicon gate region with the second gate oxide layer 126, which has a lower dielectric constant (low-k), further reduction in the electric field in that region, and hence further GIDL leakage suppression, is achieved.

During operation, the gate oxide material 127 may be delivered while the device 100 is in a first position. Following formation of the second gate oxide layer 126 along a first sidewall, the device 100 is rotated (e.g., by 30, 45, 60, or 90 degrees), and the gate oxide material 127 may again be applied to the device 100 to form the second gate oxide layer 126 along one or more additional sidewall surfaces of the trench 104.

FIG. 4 demonstrates the device 100 after deposition of a second gate material 130 and a dielectric capping layer 132 within the trench 104. In some embodiments, the first gate material 116 and the second gate material 130 may be separated by a gate isolation layer (not shown). Although non-limiting, the second gate material 130 may be highly doped polysilicon, and the dielectric capping layer 132 may be silicon nitride. The device 100 may then be planarized to remove the second gate oxide layer 126 from the upper surface 106 of the substrate layer 102. In other embodiments, the second gate oxide layer 126 may be removed from the upper surface 106 of the substrate layer 102 prior to formation of the second gate material 130 and the dielectric capping layer 132.

Figure 5:
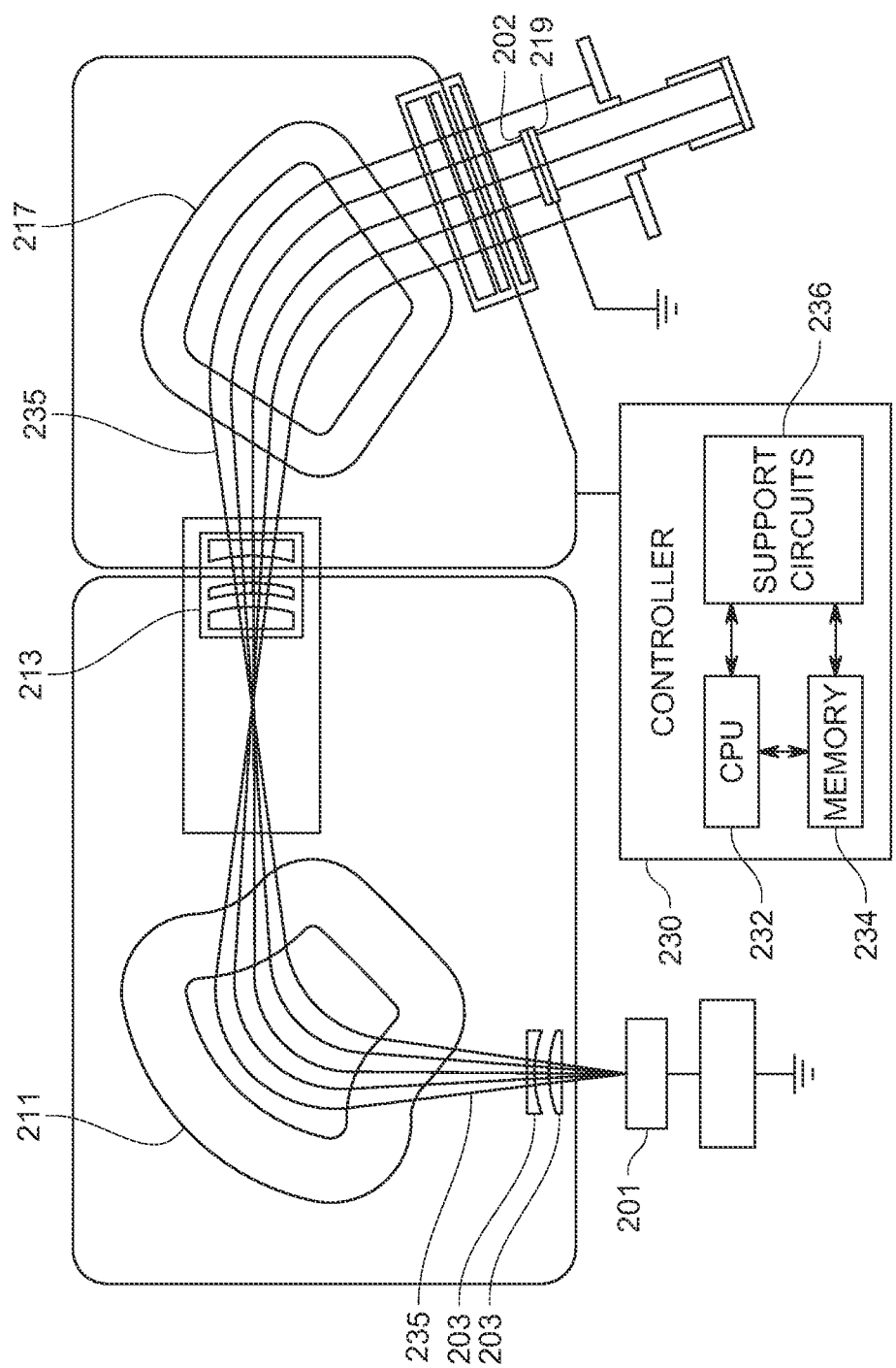
FIG. 5 illustrates a schematic diagram of a processing apparatus according to embodiments of the present disclosure.

FIG. 5 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion etch, such as the angled ion etch 120 demonstrated in FIG. 2. The ion source 201 may also provide a deposition process, such the angled gate oxide material deposition process demonstrated in FIG. 3. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same or different as the substrate layer 102 described above. The substrate 202 may be moved in one or more dimensions (e.g., translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

More specifically, during an angled reactive ion beam etching operation, such as the angled ion etch 120, an ion beam is extracted through the extraction aperture, wherein the trajectory of the ion beam forms a non-zero angle of incidence with respect to the perpendicular. The trajectories of ions within the ion beam may be mutually parallel to one another or may lie within a narrow angular range, such as within 10 degrees of one another or less. Thus, the value of the non-zero angle may represent an average value of incidence angle where the individually trajectories vary up to several degrees from the average value. The ion beam may be extracted when a voltage difference is applied using bias supply between the plasma chamber and substrate 202, as in known systems. The bias supply may be coupled to the process chamber, for example, where the process chamber and substrate 202 are held at the same potential. In various embodiments, the ion beam may be extracted as a continuous beam or as a pulsed ion beam as in known systems. For example, the bias supply may be configured to supply a voltage difference between plasma chamber and process chamber, as a pulsed DC voltage, where the voltage, pulse frequency, and duty cycle of the pulsed voltage may be independently adjusted from one another.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method of forming a dynamic random-access memory (DRAM) device, comprising:
   forming a trench in a substrate layer;
   providing a first gate oxide layer along a sidewall and a bottom surface of the trench;
   forming a first gate material within the trench;
   removing the first gate oxide layer along an upper portion of the sidewall of the trench by delivering ions into the upper portion of the trench at a non-zero angle relative to a perpendicular extending from an upper surface of the substrate layer; and
   forming a second gate oxide layer along the upper portion of the sidewall of the trench, wherein a first dielectric constant of the first gate oxide layer is greater than a second dielectric constant of the second gate oxide layer.

2. The method of claim 1, further comprising forming a second gate material within the trench after the second gate oxide layer is formed.

3. The method of claim 2, wherein forming the first gate material comprises depositing a metal within the trench, and wherein forming the second gate material comprises depositing a polysilicon over the metal.

4. The method of claim 2, further comprising forming a dielectric cap over the second gate material.

5. The method of claim 1, wherein forming the second gate oxide layer comprises delivering a gate oxide material to the sidewall of the trench at a second non-zero angle relative to the perpendicular.

6. The method of claim 1, further comprising forming the second gate oxide layer atop the upper surface of the substrate layer.

7. The method of claim 1, wherein the first gate oxide layer is removed from the upper portion of the sidewall of the trench without removing the first gate oxide layer from a lower portion of the sidewall of the trench.

8. The method of claim 7, wherein the ions are delivered into the upper portion of the trench without being delivered into the first gate material.

9. A method of forming a gate structure of a dynamic random-access memory (DRAM) device, the method comprising:
   forming a trench in a substrate layer;
   providing a first gate oxide layer along a sidewall and a bottom surface of the trench, wherein the first gate oxide layer extends to an upper surface of the substrate layer;
   forming a first gate material within the trench;
   etching the first gate oxide layer along an upper portion of the sidewall of the trench by delivering ions into just the upper portion of the trench at a non-zero angle relative to a perpendicular extending from the upper surface of the substrate layer; and
   forming a second gate oxide layer along the upper portion of the sidewall of the trench, wherein a first dielectric constant of the first gate oxide layer is greater than a second dielectric constant of the second gate oxide layer.

10. The method of claim 9, further comprising forming a second gate material within the trench after the second gate oxide layer is formed.

11. The method of claim 10, wherein forming the first gate material comprises depositing a metal within the trench, and wherein forming the second gate material comprises depositing a polysilicon over the metal.

12. The method of claim 10, wherein forming the second gate oxide layer comprises delivering a gate oxide material to the sidewall of the trench at a second non-zero angle relative to the perpendicular, and wherein the second gate oxide layer is formed atop the upper surface of the substrate layer.

13. The method of claim 10, further comprising forming a dielectric cap over the second gate material.

14. The method of claim 9, wherein the first gate oxide layer is removed from the upper portion of the sidewall of the trench without removing the first gate oxide layer from a lower portion of the sidewall of the trench.

15. The method of claim 14, wherein the ions are delivered into the upper portion of the trench without being delivered into the first gate material.

* * * * *